(12) United States Patent
Sadaka et al.

(10) Patent No.: US 8,481,406 B2
(45) Date of Patent: Jul. 9, 2013

(54) METHODS OF FORMING BONDED SEMICONDUCTOR STRUCTURES

(75) Inventors: Mariam Sadaka, Austin, TX (US); Ionut Radu, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/837,326

(22) Filed: Jul. 15, 2010

(65) Prior Publication Data

US 2012/0013012 A1    Jan. 19, 2012

(51) Int. Cl.
*H01L 21/30* (2006.01)

(52) U.S. Cl.
USPC ............................... 438/458; 257/E21.211

(58) Field of Classification Search
None
See application file for complete search history.

(56) References Cited

U.S. PATENT DOCUMENTS

| 7,041,178 B2 * | 5/2006 | Tong et al. ............... 148/33.4 |
| 7,205,211 B2 | 4/2007 | Aspar et al. |
| 2004/0219765 A1 | 11/2004 | Reif et al. |
| 2008/0038859 A1 | 2/2008 | Chang et al. |
| 2009/0057890 A1 | 3/2009 | Maebashi et al. |
| 2010/0068868 A1 | 3/2010 | Kim et al. |

FOREIGN PATENT DOCUMENTS

| EP | 0977252 A1 | 2/2000 |
| FR | 2880189 A1 | 6/2006 |
| WO | 0161743 A1 | 8/2001 |
| WO | 2008045669 A1 | 4/2008 |

OTHER PUBLICATIONS

Maszara, W.P., et al., Bonding of Silicon Wafers for Silicon-on-Insulator, J. Appl. Phys., Nov. 15, 1988, pp. 4943-4950, vol. 64, No. 10, American Institute of Physics.
Tong, Q.Y., et al., Basics of Interactions Between Flat Services, Semiconductor Wafer Bonding: Science and Technology, Chapter 2, 1999, 10 sheets, John Wiley & Sons, Inc.
French Preliminary Search Report for French Application No. 1055965 dated Mar. 31, 2011, 5 pages.
French Written Opinion for French Application No. 1055965 dated Mar. 31, 2011, 8 pages.
Koester et al, Wafer-Level 3D Integration Technology, Nov. 2008 IBM Journal of Research and Development, vol. 52, No. 6, Nov. 2008, pp. 583-597.
Hungarian Search Report for Singapore Application No. 201104201-7 dated Feb. 2, 2012, 6 pages.
Hungarian Written Opinion for Singapore Application No. 201104201-7 dated Feb. 2, 2012, 7 pages.

* cited by examiner

*Primary Examiner* — Seahvosh Nikmanesh
(74) *Attorney, Agent, or Firm* — TraskBritt

(57) ABSTRACT

Methods of forming bonded semiconductor structures include temporarily, directly bonding together semiconductor structures, thinning at least one of the semiconductor structures, and subsequently permanently bonding the thinned semiconductor structure to another semiconductor structure. The temporary, direct bond may be established without the use of an adhesive. Bonded semiconductor structures are fabricated in accordance with such methods.

24 Claims, 6 Drawing Sheets

METHODS OF FORMING BONDED SEMICONDUCTOR STRUCTURES

FIELD

Embodiments of the present invention generally relate to methods for forming bonded semiconductor structures, and to the resulting structures formed using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device foot print. See, for example, P. Garrou, et al., "The Handbook of 3D Integration," Wiley-VCH (2008).

The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

Often, the individual semiconductor dies or wafers may be relatively thin and difficult to handle with equipment for processing the dies or wafers. Thus, so-called "carrier" dies or wafers may be attached to the actual dies or wafers that include therein the active and passive components of operative semiconductor devices. The carrier dies or wafers do not typically include any active or passive components of a semiconductor device to be formed. Such carrier dies and wafers are referred to herein as "carrier substrates." The carrier substrates increase the overall thickness of the dies or wafers and facilitate handling of the dies or wafers by processing equipment used to process the active and/or passive components in the dies or wafers attached thereto that will include the active and passive components of a semiconductor device to be fabricated thereon. Such dies or wafers that include the active and/or passive components of a semiconductor device to be fabricated thereon, or that will ultimately include the active and/or passive components of a semiconductor device to be fabricated thereon upon completion of the manufacturing process, are referred to herein as "device substrates."

Carrier substrates are typically attached to device substrates using an adhesive. Similar bonding methods may also be used to secure one die or wafer that includes active and/or passive components of one or more semiconductor devices therein to another die or wafer that also includes active and/or passive components of one or more semiconductor devices therein.

The adhesives typically used to bond one die or wafer (e.g., a carrier substrate) to another die or wafer (e.g., a device substrate) may present problems in subsequent processing steps used to fabricate active and/or passive components of one or more semiconductor devices in the dies or wafers.

BRIEF SUMMARY

Embodiments of the present invention may provide methods and structures for forming semiconductor structures, and, more particularly, methods and structures for forming bonded semiconductor structures. This summary is provided to introduce a selection of concepts, in a simplified form, that is further described in the detailed description of embodiments of the invention. This summary is not intended to identify key features or essential features of the claimed subject matter, nor is it intended to be used to limit the scope of the claimed subject matter.

Therefore, in some embodiments of the present invention, methods of forming bonded semiconductor structures include temporarily bonding a first semiconductor structure to a second semiconductor structure by providing direct atomic or molecular bonds between a bonding surface of the first semiconductor structure and a bonding surface of the second semiconductor structure. The first semiconductor structure may be selected to have an active surface on a first side of the first semiconductor structure and a back surface on a second, opposite side of the first semiconductor structure and to comprise at least one device structure formed over a substrate. The substrate of the first semiconductor structure may be thinned by removing material of the substrate from the back surface of the first semiconductor structure. The back surface of the first semiconductor structure may be permanently bonded to a surface of a third semiconductor structure after thinning the substrate of the first semiconductor structure and while the first semiconductor structure remains temporarily bonded to the second semiconductor structure. The second semiconductor structure then may be separated from the first semiconductor structure.

In additional embodiments of the invention, methods of forming semiconductor structures include temporarily bonding a first semiconductor structure to a second semiconductor structure without using an adhesive between a bonding surface of the first semiconductor structure and a bonding surface of the second semiconductor structure. The first semiconductor structure is selected to have an active surface on a first side of the first semiconductor structure and a back surface on a second, opposite side of the first semiconductor structure, and to comprise at least one device structure formed over a substrate. The back surface of the first semiconductor structure is permanently bonded to a surface of a third semiconductor structure while the first semiconductor structure remains temporarily bonded to the second semiconductor structure. The second semiconductor structure then may be separated from the first semiconductor structure.

Embodiments of the invention also comprise semiconductor structures that include a first semiconductor structure and a second semiconductor structure temporarily bonded to the first semiconductor structure without adhesive therebetween. The first semiconductor structure has an active surface on a first side of the first semiconductor structure and a back surface on a second, opposite side of the first semiconductor structure. The first semiconductor structure comprises a substrate and at least one device structure formed over the substrate. A bonding energy between the first semiconductor structure and the second semiconductor structure is about 1,000 mJ/m² or less. A third semiconductor structure is permanently bonded to the back surface of the first semiconductor structure, and a bonding energy between the first semiconductor structure and the third semiconductor structure is at least about 1,200 mJ/m².

BRIEF DESCRIPTION OF THE DRAWINGS

Embodiments of the present invention may be understood more fully by reference to the following detailed description of embodiments of the present invention and the appended figures in which.

DETAILED DESCRIPTION

Figure 1A:
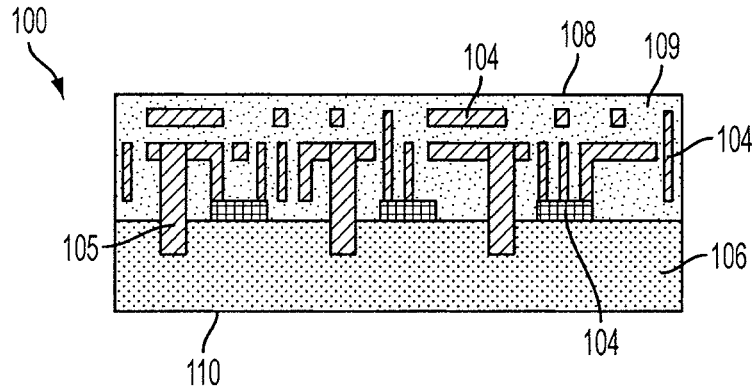
FIGS. 1A through 1E are simplified, schematic cross-sectional views of semiconductor structures and illustrate example embodiments of the invention for forming bonded semiconductor structures.

The illustrations presented herein are not meant to be actual views of any particular material, device, system, or method, but are merely idealized representations that are used to describe embodiments of the invention.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

As used herein, the term "III-V semiconductor material" means and includes any material predominantly comprised of one or more elements from group IIIA of the periodic table (B, Al, Ga, In, and Tl) and one or more elements from group VA of the periodic table (N, P, As, Sb, and Bi).

As used herein, the term "coefficient of thermal expansion," when used with respect to a material or structure, means the average linear coefficient of thermal expansion of the material or structure at room temperature.

Embodiments of the invention comprise methods and structures for forming semiconductor structures and, more particularly, semiconductor structures that include bonded semiconductor structures and methods of forming such bonded semiconductor structures. Embodiments of methods and structures of the invention may be utilized for various purposes, such as for 3D integration processes and to form 3D integrated structures.

Example embodiments of the invention are described below with reference to FIGS. 1A through 1E. FIG. 1A illustrates a processed semiconductor structure 100. Processed semiconductor structure 100 may include a number of device structures 104. The device structures 104 are formed in and/or over a substrate 106. The substrate 106 may comprise one or more materials. Such materials may comprise, for example, a semiconductor material such as silicon (Si), germanium (Ge), a III-V semiconductor material, etc. Furthermore, the substrate 106 may comprise a single crystal of semiconductor material or an epitaxial layer of semiconductor material. In additional embodiments, the substrate 106 may comprise one or more dielectric materials, such as an oxide (e.g., silicon dioxide ($SiO_2$) or aluminum oxide ($Al_2O_3$)), a nitride (e.g., silicon nitride ($Si_3N_4$) or boron nitride (BN)), etc.

As shown in FIG. 1A, the device structures 104 include a plurality of TWIs 105. Each TWI 105 may comprise a generally columnar (e.g., cylindrical) structure comprising an electrically conductive material, such as one or more metals or metal alloys. Each TWI 105 also may comprise a multi-layer or multi-region structure including, for example, transition regions, barrier regions, conductive regions, etc., each of which may comprise a different material. The processed semiconductor structure 100 includes an active surface 108 and a back surface 110. The back surface 110 of the processed semiconductor structure 100 may comprise a generally flat, exposed major surface of the substrate 106. The active surface 108 of the processed semiconductor structure 100 may comprise a dielectric material 109, such as an oxide (e.g., silicon dioxide ($SiO_2$) or aluminum oxide ($Al_2O_3$)), a nitride (e.g., silicon nitride ($Si_3N_4$) or boron nitride (BN)), etc.

Figure 1B:
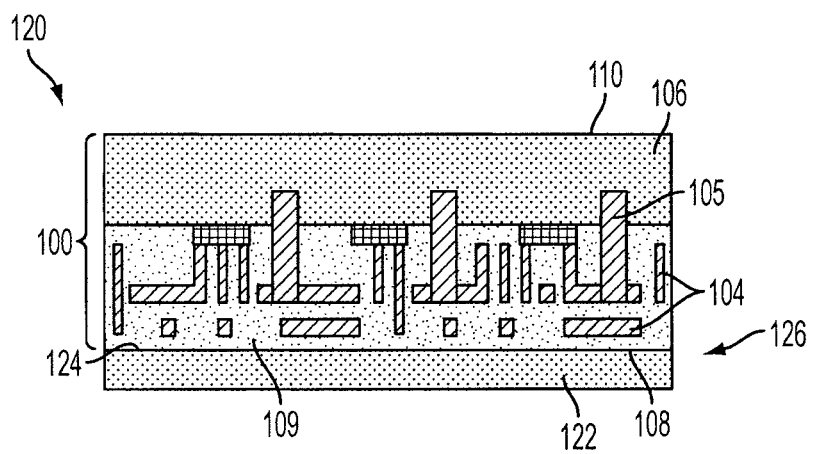

FIG. 1B illustrates a bonded semiconductor structure 120 that may be formed by temporarily bonding the processed semiconductor structure 100 of FIG. 1A to another semiconductor structure 122. The semiconductor structure 122 may comprise, for example, a carrier substrate. For example, the semiconductor structure 122 may comprise a semiconductor material, such as silicon (Si), germanium (Ge), a III-V semiconductor material, etc. The semiconductor structure 122 optionally may comprise a single crystal of semiconductor material or an epitaxial layer of semiconductor material. In additional embodiments, the semiconductor structure 122 may comprise one or more dielectric materials, such as an oxide (e.g., silicon dioxide ($SiO_2$) or aluminum oxide ($Al_2O_3$)), a nitride (e.g., silicon nitride ($Si_3N_4$), boron nitride (BN) or aluminum nitride (AlN)), etc. The semiconductor structure 122 may comprise a material selected to exhibit a coefficient of thermal expansion that is at least substantially equal to a coefficient of thermal expansion exhibited by the semiconductor structure 100 of FIG. 1A (e.g., within about twenty percent (20%) of the coefficient of thermal expansion exhibited by the semiconductor structure 100).

With continued reference to FIG. 1B, the processed semiconductor structure 100 may be temporarily, directly bonded to the semiconductor structure 122 by providing direct atomic or molecular bonds between a bonding surface of the processed semiconductor structure 100 and the semiconductor structure 122 along a bonding interface 126 therebetween. In other words, the processed semiconductor structure 100 may be temporarily, directly bonded to the semiconductor structure 122 without using an adhesive or any other intermediate bonding material between the processed semiconductor structure 100 (FIG. 1A) and the semiconductor structure 122. The nature of the atomic or molecular bonds between the processed semiconductor structure 100 and the semiconductor structure 122 will depend upon the material compositions of each of the processed semiconductor structure 100 and the semiconductor structure 122. Thus, in accordance with some embodiments, direct atomic or molecular bonds may be provided between, for example, at least one of silicon oxide and germanium oxide, and at least one of silicon, germanium, silicon oxide, and germanium oxide.

By way of example and not limitation, the active surface 108 of the semiconductor structure 100 may comprise an oxide material (e.g., silicon dioxide ($SiO_2$)), and the semiconductor structure 122 may be at least substantially comprised of the same oxide material (e.g., silicon dioxide ($SiO_2$)). In such embodiments, a silicon oxide-to-silicon oxide surface direct-bonding process may be used to bond the active surface 108 of the semiconductor structure 100 to a bonding surface 124 of the semiconductor structure 122.

The bond strength may be defined as the ability of a bonded semiconductor structure to withstand interface delamination by external loading. Bond strength may be characterized by a specific bonding (surface) energy. The bonding energy may also be defined as the average specific surface energy (given the symbol $\gamma$) of the two bonding surfaces of the bonded semiconductor structure and equals the energy required to separate two bonded surfaces), i.e, where $\gamma = \frac{1}{2} n E_b$, wherein n is the number of bonds formed on a unit area (bond density) and $E_b$ is the energy of each bond.

A common approach for the measurement of bonding strength uses a double cantilever beam test geometry under constant wedging conditions. A wedge of a thickness h is inserted at the bonding interface between two wafers of thickness t so as to debond an area of crack length L. The surface energy is then calculated using the simple formula:

$$\gamma = \frac{3h^2 E t^3}{32 L^4}.$$

Further information regarding this common approach can be found in the publications of Maszara et al., J. Appl. Phys., 64, 4943 (1988) and Tong et al., Semiconductor Wafer Bonding: Science and technology, p. 27, Wiley, New York (1999).

The direct temporary bond established between the active surface 108 of the semiconductor structure 100 and the bonding surface 124 of the semiconductor structure 122 may result in a bonding energy between the active surface 108 of the semiconductor structure 100 and the bonding surface 124 of the semiconductor structure 122 that is between about 10 $mJ/m^2$ and about 1,000 $mJ/m^2$. More particularly, the direct temporary bond established between the active surface 108 of the semiconductor structure 100 and the bonding surface 124 of the semiconductor structure 122 may result in a bonding energy between the active surface 108 of the semiconductor structure 100 and the bonding surface 124 of the semiconductor structure 122 that is between about 300 $mJ/m^2$ and about 700 $mJ/m^2$.

In some embodiments, the direct temporary bond between the active surface 108 of the semiconductor structure 100 and the bonding surface 124 of the semiconductor structure 122 may be established by forming each of the active surface 108 of the processed semiconductor structure 100 and the bonding surface 124 of the semiconductor structure 122 to have relatively smooth surfaces, and subsequently abutting the active surface 108 and the bonding surface 124 together and maintaining contact between the active surface 108 and the bonding surface 124 during an annealing process.

For example, each of the active surface 108 of the semiconductor structure 100 and the bonding surface 124 of the semiconductor structure 122 may be formed to have a root mean squared surface roughness ($R_{RMS}$) of about two nanometers (2.0 nm) or less, about one nanometer (1.0 nm) or less, or even about one-quarter of a nanometer (0.25 nm) or less. In some embodiments, each of the active surface 108 of the semiconductor structure 100 and the bonding surface 124 of the semiconductor structure 122 may be formed to have a root mean squared surface roughness ($R_{RMS}$) of between about one-quarter of a nanometer (0.25 nm) and about two nanometers (2.0 nm), or even between about one-half of a nanometer (0.5 nm) and about one nanometer (1.0 nm).

The annealing process may comprise heating the semiconductor structure 100 and the semiconductor structure 122 in a furnace at a temperature of between about one hundred degrees Celsius (100° C.) and about four hundred degrees Celsius (400° C.) for a time of between about two minutes (2 min) and about fifteen hours (15 hr).

Each of the active surface 108 of the semiconductor structure 100 and the bonding surface 124 of the semiconductor structure 122 may be formed to be relatively smooth, as mentioned above, using at least one of a mechanical polishing process and a chemical etching process. For example, a chemical-mechanical polishing (CMP) process may be used to planarize and/or reduce the surface roughness of each of the active surface 108 of the semiconductor structure 100 and the bonding surface 124 of the semiconductor structure 122.

At least one of the active surface 108 of the semiconductor structure 100 and the bonding surface 124 of the semiconductor structure 122 may be activated prior to establishing the direct temporary bond along the bonding interface 126 therebetween to increase the bonding energy between the active surface 108 of the semiconductor structure 100 and the bonding surface 124 of the semiconductor structure 122. In other words, the surface chemistry of at least one of the active surface 108 of the semiconductor structure 100 and the bonding surface 124 of the semiconductor structure 122 may be selectively altered prior to establishing the temporary, direct bond therebetween. The surface chemistry may be altered to selectively tailor the bonding energy at the interface between the active surface 108 of the semiconductor structure 100 and the bonding surface 124 of the semiconductor structure 122 to be within the ranges mentioned herein. As a non-limiting example, a plasma activation process may be used to activate at least one of the active surface 108 of the semiconductor structure 100 and the bonding surface 124 of the semiconductor structure 122. Treatment by plasma activation may be carried out in a plasma chamber according to the following conditions:

oxygen, nitrogen, argon or helium gas with gas flow between 0 and 100 sccm (e.g., between 50 and 75 sccm);
power between 25 and 2500 Watts (e.g., between 150 and 1000 Watts);
pressure between 20 and 200 mTorr (e.g., between 50 and 100 mTorr); and
exposure duration between 5 sec and 5 min (e.g., between 10 and 60 seconds).

In some embodiments, only one of the processed semiconductor structure 100 and the semiconductor structure 122 may be subjected to a surface activation process as described above, and the other may not be subjected to a surface activation process to selectively tailor a bonding energy between the processed semiconductor structure 100 and the semiconductor structure 122 and/or reduce the likelihood of inadvertent formation of a permanent bond therebetween.

Furthermore, prior to the annealing process, at least one of the active surface 108 of the processed semiconductor structure 100 and the bonding surface 124 of the semiconductor structure 122 may be subjected to one or more cleaning processes. For example, the active surface 108 and the bonding surface 124 may be cleaned to remove organic contaminants and/or ionic contaminants. In embodiments in which the active surface 108 and the bonding surface 124 comprise materials that are not oxides but that are subject to oxidation, the active surface 108 and the bonding surface 124 may be subjected to an oxide-stripping process.

As a non-limiting example, the processed semiconductor structure 100 and the semiconductor structure 122 may be soaked in de-ionized (DI) water, after which they may be bathed in a 1:1:5 solution of ammonium hydroxide ($NH_4OH$), hydrogen peroxide ($H_2O_2$), and water ($H_2O$) at a temperature of between about fifty degrees Celsius (50° C.) and about eighty degrees Celsius (80° C.) for between about one minute (1 min) and about fifteen minutes (15 min). This first cleaning process may result in the formation of a thin silicon dioxide layer on the treated surfaces. The processed semiconductor structure 100 and the semiconductor structure 122 then may be returned to a bath of de-ionized (DI) water, after which they may be immersed in a 1:50 solution of hydrofluoric acid (HF) and water ($H_2O$) at between about twenty degrees Celsius (20° C.) and about thirty degrees Celsius (30° C.) for between about ten seconds (10 sec) and about five minutes (5 min). This cleaning process may remove any silicon dioxide layer formed by the first cleaning process, as well as some ionic contaminants. The processed semiconductor structure 100 and the semiconductor structure 122 then may be returned to a bath of de-ionized (DI) water, after which they may be immersed in a 1:1:6 solution of hydrochloric acid (HCl) hydrogen peroxide ($H_2O_2$), and water ($H_2O$) at a temperature of between about fifty degrees Celsius (50° C.) and about eighty degrees Celsius (80° C.) for between about one minute (1 min) and about fifteen minutes (15 min). This cleaning process may remove any remaining ionic contaminants (e.g., metal ions).

In some embodiments, only one of the processed semiconductor structure 100 and the semiconductor structure 122 may be subjected to a cleaning process as described above, and the other may not be subjected to a cleaning process to reduce the likelihood of inadvertent formation of a permanent bond therebetween.

In additional embodiments, a direct, temporary bond may be established between the active surface 108 of the processed semiconductor structure 100 and the bonding surface 124 of the semiconductor structure 122 using methods as described below with reference to FIGS. 3 and 4. In the methods described with reference to FIGS. 3 and 4, a bonded interface area may be formed between the active surface 108 of the processed semiconductor structure 100 and the bonding surface 124 of the semiconductor structure 122, and the bonded interface area is selected to be less than the total area between the active surface 108 of the processed semiconductor structure 100 and the bonding surface 124 of the semiconductor structure 122 along the bonding interface 126 therebetween. The bonded interface area is defined as the area between the processed semiconductor structure 100 and the semiconductor structure 122 over which direct atomic and/or molecular bonds are present.

For example, the bonded interface area between the active surface 108 of the processed semiconductor structure 100 and the bonding surface 124 of the semiconductor structure 122 may be selectively formed to be less than about eighty percent (80%), less than about fifty percent (50%), or even less than about twenty percent (20%) of the total area between the active surface 108 of the processed semiconductor structure 100 and the bonding surface 124 of the semiconductor structure 122 along the bonding interface 126 therebetween.

To reduce the bonded interface area between the processed semiconductor structure 100 and the semiconductor structure 122, a plurality of recesses may be formed in or over at least one of the active surface 108 of the processed semiconductor structure 100 and the bonding surface 124 of the semiconductor structure 122. For example, FIG. 3 illustrates a plurality of recesses 130 formed on the semiconductor structure 122. The recesses 130 may be formed by patterning the semiconductor structure 122 or a material provided on the semiconductor structure 122. For example, a dielectric material 128 (e.g., a layer of an oxide material, such as silicon dioxide ($SiO_2$)) may be formed over the semiconductor structure 122, and the dielectric material 128 may be patterned using a masking and etching process to form the recesses 130 in the dielectric material 128. A patterned mask layer may be formed over the dielectric material 128 using photolithographic processes known in the art. The patterned mask layer may include apertures therethrough at the locations at which it is desired to form the recesses 130 in the underlying dielectric material 128. The dielectric material 128 exposed through the apertures in the overlying patterned mask layer then may be subjected to an etchant using a wet chemical etching process or a dry reactive ion etching process.

Recesses (such as the recesses 130 on the semiconductor structure 122) optionally may also be formed in or on the active surface 108 of the processed semiconductor structure 100.

Figure 3:
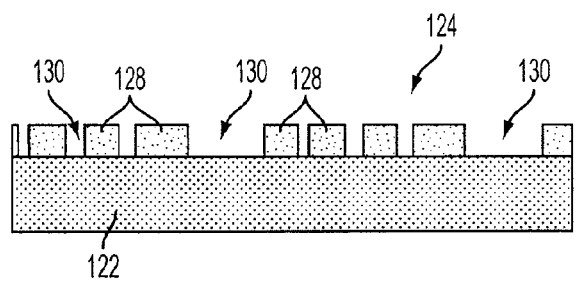
FIGS. 3 and 4 are simplified, schematic cross-sectional views of semiconductor structures and illustrate an example of a method that may be used to temporarily bond one semiconductor structure (e.g., die or wafer) to another semiconductor structure (e.g., another die or wafer)
Figure 4:
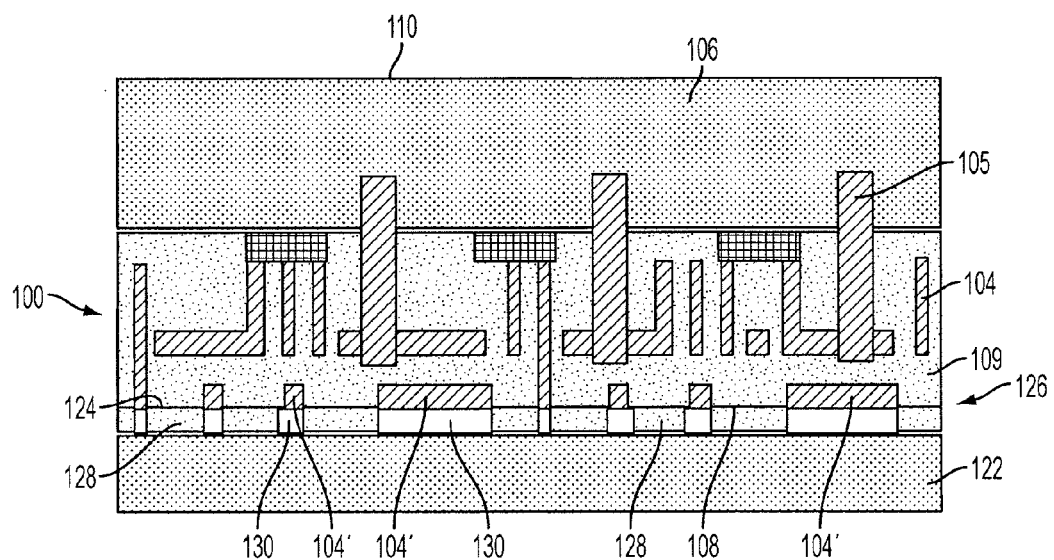

Referring to FIG. 4, after forming the recesses 130 in or on one or both of the bonding surface 124 of the semiconductor structure 122 and the active surface 108 of the processed semiconductor structure 100, a direct temporary bond may be established between the active surface 108 of the processed semiconductor structure 100 and the bonding surface 124 of the semiconductor structure 122, as previously discussed in relation to FIG. 3. As shown in FIG. 4, the bonded interface area between the processed semiconductor structure 100 and the semiconductor structure 122 is the area over which the dielectric material 128 abuts against the active surface 108 of the processed semiconductor structure 100 (the area not occupied by the recesses 130).

As shown in FIG. 4, in some embodiments, the active surface 108 of the processed semiconductor structure 100 may include exposed conductive device features 104' (e.g., bond pads, traces, etc.). Such conductive device features 104' may comprise, for example, a metallic material (i.e., a metal or a metal alloy). In such embodiments, the plurality of recesses 130 may be formed in a pattern that is selected to comprise a mirror image of a pattern of the conductive device features 104'. As a result, the recesses 130 may be aligned with the conductive device features 104' upon establishing the temporary bond between the processed semiconductor structure 100 and the semiconductor structure 122. The bond established between the processed semiconductor structure 100 and the semiconductor structure 122 may comprise direct atomic or molecular bonds between the dielectric material 128 of the semiconductor structure 122 and a dielectric material 109 of the processed semiconductor structure 100 surrounding the conductive device features 104' at the active surface 108 of the processed semiconductor structure 100.

In such embodiments, the materials of the conductive device features 104' may not be contacted by the semiconductor structure 122 in any significant manner during the bonding process, which may prevent oxidation and/or other forms of degradation of the characteristics of the conductive device features 104' that might otherwise occur upon bonding the processed semiconductor structure 100 and the semiconductor structure 122.

In additional embodiments, a direct, temporary bond may be established between the active surface 108 of the processed semiconductor structure 100 and the bonding surface 124 of the semiconductor structure 122 using methods as described below with reference to FIGS. 5 through 7.

In the methods described with reference to FIGS. 5 through 7, as in the methods described with reference to FIGS. 3 and 4, a bonded interface area may be formed between the active surface 108 of the processed semiconductor structure 100 and the bonding surface 124 of the semiconductor structure 122 that is selected to be less than the total area between the active surface 108 of the processed semiconductor structure 100 and the bonding surface 124 of the semiconductor structure 122 along the bonding interface 126 therebetween. Furthermore, as discussed in relation to FIGS. 3 and 4, a plurality of recesses 130 may be formed in or over at least one of the active surface 108 of the processed semiconductor structure 100 and the bonding surface 124 of the semiconductor structure 122 to reduce the bonded interface area between the processed semiconductor structure 100 and the semiconductor structure 122. For example, FIG. 5 illustrates recesses 130 formed on the semiconductor structure 122. The recesses 130 may be formed as previously described in relation to FIG. 3. Recesses (such as the recesses 130 on the semiconductor structure 122) optionally may also be formed in or on the active surface 108 of the processed semiconductor structure 100.

Figure 5:
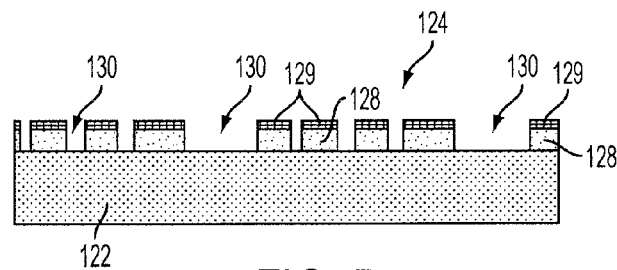
FIGS. 5 through 7 are simplified, schematic cross-sectional views of semiconductor structures and illustrate another example of a method that may be used to temporarily bond one semiconductor structure to another semiconductor structure.

As shown in FIG. 5, another dielectric material 129 may be provided over the dielectric material 128 on the areas outside the recesses 130 on the bonding surface 124 of the semiconductor structure 122. The dielectric material 129 may be provided over the dielectric material 128 prior to forming the recesses 130. In other words, the dielectric material 129 may be provided (e.g., deposited) over the dielectric material 128 on the bonding surface 124 of the semiconductor structure 122, and the plurality of recesses 130 may be formed through the dielectric material 129 and at least a portion of the dielectric material 128. In additional embodiments, the dielectric material 129 may be provided over the dielectric material 128 after forming the recesses 130. In such embodiments, the dielectric material 129 may be provided only over surfaces of the dielectric material 128 outside the recesses 130, and not over surfaces of the dielectric material 128 within the recesses 130.

In some embodiments, the dielectric material 128 may be selected to comprise a high-temperature dielectric material, and the dielectric material 129 may be selected to comprise a low-temperature dielectric material. As used herein, the term "low-temperature dielectric material" means and includes any dielectric material that will undergo at least one of degradation, decomposition, and out-gassing upon heating the dielectric material to a known temperature below four hundred degrees Celsius (400° C.). As used herein, the term "high-temperature dielectric material" means and includes any dielectric material that will not undergo any of degradation, decomposition, and out-gassing upon heating the dielectric material to four hundred degrees Celsius (400° C.).

As non-limiting examples, the high-temperature dielectric material 128 may comprise an oxide (e.g., silicon dioxide ($SiO_2$) or aluminum oxide ($Al_2O_3$)) or a nitride (e.g., silicon nitride ($Si_3N_4$) or boron nitride (BN)), Aluminum Nitride (AlN).

As non-limiting examples, the low-temperature dielectric material 129 may comprise tetraethylorthosilicate (TEOS) or a polymer material.

Figure 6:
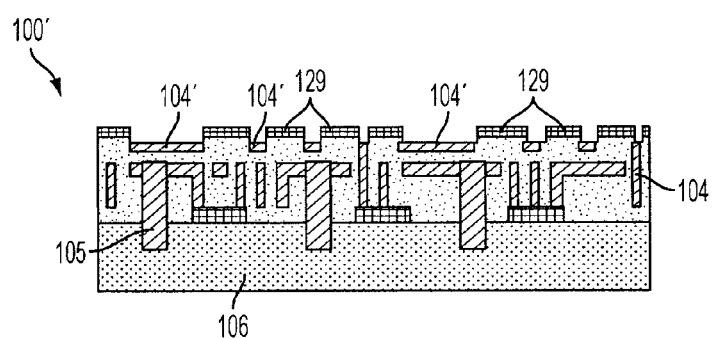

As shown in FIG. 6, a low-temperature dielectric material 129 also may be provided over an area or areas of the active surface 108 of a processed semiconductor structure 100'. For example, as previously mentioned, in some embodiments, the active surface 108 of the processed semiconductor structure 100' may include exposed conductive device features 104' (e.g., bond pads, traces, etc.). In such embodiments, a low-temperature dielectric material 129 may be patterned using a masking and etching process to form the recesses 104' in the dielectric material 129 and 128. A patterned mask layer may be formed over the dielectric material 129 using photolithographic processes known in the art. The patterned mask layer may include apertures therethrough at the locations at which it is desired to form the recesses 104' in the underlying dielectric material 129 & 128. The dielectric material 129 & 128 exposed through the apertures in the overlying patterned mask layer then may be subjected to an etchant using a wet chemical etching process or a dry reactive ion etching process. The dielectric material 129 & 128 do not cover the exposed conductive device features 104' in any significant manner, as shown in FIG. 6.

Figure 7:
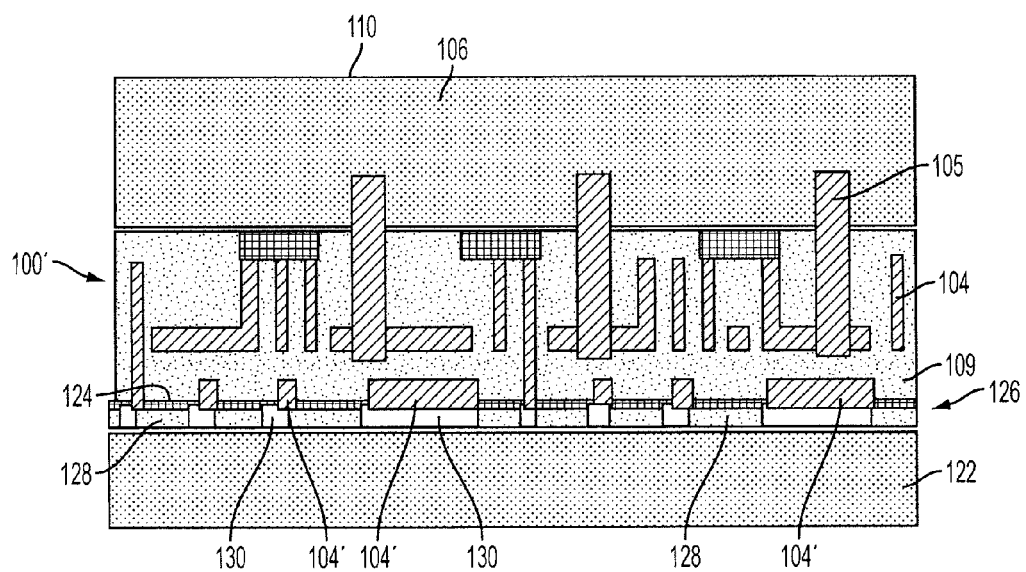

Referring to FIG. 7, after providing the low-temperature dielectric material 129 over at least one of the active surface 108 of the semiconductor structure 100' and the bonding surface 124 of the semiconductor structure 122, and after forming the recesses 130 in or on one or both of the bonding surface 124 of the semiconductor structure 122 and the active surface 108 of the processed semiconductor structure 100', a direct temporary bond may be established between the active surface 108 of the processed semiconductor structure 100' and the bonding surface 124 of the semiconductor structure 122, as previously discussed in relation to FIG. 3. As shown in FIG. 7, the bonded interface area between the processed semiconductor structure 100' and the semiconductor structure 122 is the area over which the dielectric material 128 abuts against the active surface 108 of the processed semiconductor structure 100' (i.e., the area not occupied by the recesses 130).

As previously described in relation to FIGS. 3 and 4, the plurality of recesses 130 may be formed in a pattern that is selected to comprise a mirror image of a pattern of the conductive device features 104'. As a result, the recesses 130 may be aligned with the conductive device features 104' upon establishing the temporary bond between the processed semiconductor structure 100' and the semiconductor structure 122. The bond established between the processed semiconductor structure 100' and the semiconductor structure 122 may comprise direct atomic or molecular bonds between the low-temperature dielectric material 129 of the semiconductor structure 122 and the low-temperature dielectric material 109 of the processed semiconductor structure 100'. In such embodiments, the materials of the conductive device features 104' may not be contacted by the semiconductor structure 122 in any significant manner during the bonding process, which may prevent oxidation and/or other forms of degradation of the characteristics of the conductive device features 104' that might otherwise occur upon bonding the processed semiconductor structure 100' and the semiconductor structure 122.

In temporarily bonding the semiconductor structure 122 to the processed semiconductor structure 100', the semiconductor structure 122 and the processed semiconductor structure 100' may be heated at least to a known temperature at which the low-temperature dielectric material 129 will undergo at least one of degradation, decomposition, and out-gassing. As a result, the low-temperature dielectric material 129 will degrade, decompose, and/or out-gas during the bonding process, which may result in formation of a relatively weaker bond between the semiconductor structure 122 and the processed semiconductor structure 100' than would otherwise occur in the absence of such degradation, decomposition, and/or out-gassing. Such a weaker, temporary bond may facilitate subsequent separation of the semiconductor structure 122 from the processed semiconductor structure 100', as discussed in further detail below.

Referring back to FIG. 1C, after temporarily bonding the semiconductor structure 122 to the processed semiconductor structure 100, the substrate 106 of the processed semiconductor structure 100 may be thinned to form another semiconductor structure 140. The substrate 106 may be thinned by, for example, removing material of the substrate 106 from the back surface 110 thereof. The material may be removed from the back surface 110 of the substrate 106 using at least one of a mechanical polishing process and a chemical etching process. For example, a chemical-mechanical polishing (CMP) process may be used to remove material of the substrate 106 from the back surface 110.

Figure 1C:
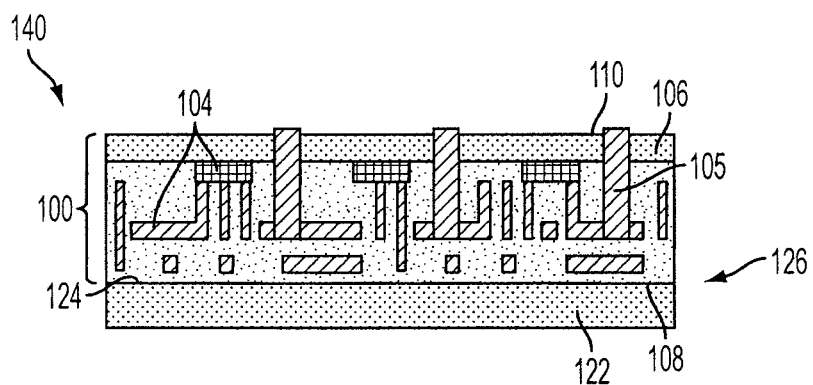

As shown in FIG. 1C, the processed semiconductor structure 100 may include TWIs 105 that extend partially through the substrate 106, and the substrate 106 may be thinned to a point at which the TWIs 105 are exposed through the back surface 110 of the substrate 106 of the processed semiconductor structure 100.

Figure 1D:
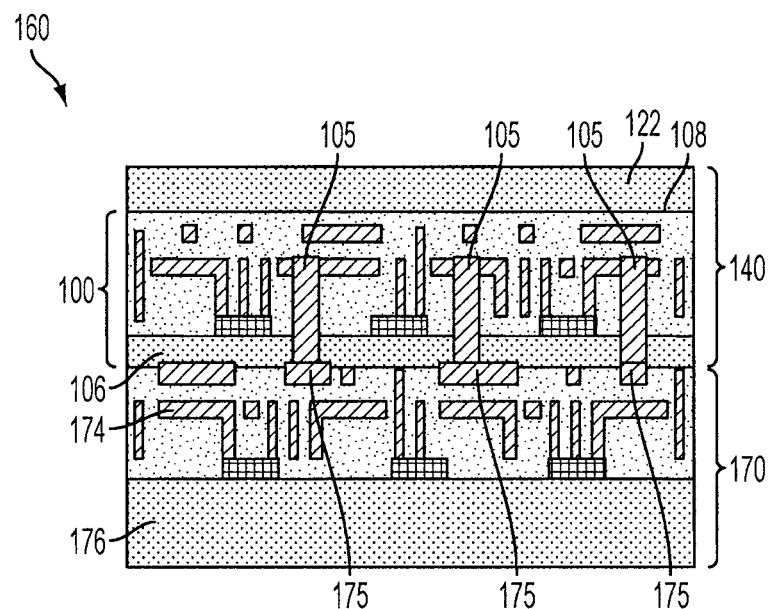

FIG. 1D illustrates another semiconductor structure 160 that may be fabricated by forming a permanent bond between the semiconductor structure 140 of FIG. 1C and another processed semiconductor structure 170. The permanent bond established between the semiconductor structure 140 and the semiconductor structure 170 along a bonding interface therebetween may result in a bonding energy between the semiconductor structure 140 and the semiconductor structure 170 that is at least about 1,200 mJ/m$^2$. More particularly, the permanent bond established between the semiconductor structure 140 and the semiconductor structure 170 may result in a bonding energy between the semiconductor structure 140 and the semiconductor structure 170 that is between about 1,600 mJ/m$^2$ and about 3,000 mJ/m$^2$.

The processed semiconductor structure 170 may be generally similar to the processed semiconductor structure 100 of FIG. 1A, and may include a number of device structures 174 formed in and/or over a substrate 176, although the type and/or design of the processed semiconductor structure 170 may differ from that of the processed semiconductor structure 100. The substrate 176 may comprise a semiconductor material, such as any of those previously described in relation to the substrate 106 of FIG. 1A. The processed semiconductor structure 170 also may comprise metallic structures 175, which may be structurally and/or electrically coupled to the TWIs 105 of the semiconductor structure 140. The metallic structures 175 may comprise one or more of electrically conductive pads, traces, lines, etc. Furthermore, the metallic structures 175 may comprise a multi-layer or multi-region structure including, for example, transition regions, barrier regions, conductive regions, etc., each of which may comprise a different material.

In some embodiments, the TWIs 105 and the metallic structures 175 may comprise the same material (e.g., a metal or metal alloy, such as a copper-based alloy), and a metal-metal bond may be established between the TWIs 105 and the metallic structures 175. For example, a metal-metal thermocompression bonding process may be used to form a bond between the TWIs 105 and the metallic structures 175. In such methods, pressure may be applied between the semiconductor structure 140 and the processed semiconductor structure 170 while the semiconductor structure 140 and the processed semiconductor structure 170 are heated. The combination of pressure and heat results in the formation of a metal-metal bond between the TWIs 105 and the metallic structures 175. For example a pressure of between about 0.14 MPa and about 1.43 MPa may be applied between the semiconductor structure 140 and the processed semiconductor structure 170 while the semiconductor structure 140 and the processed semiconductor structure 170 are heated to a temperature of between about 200° C. and about 400° C. To avoid oxidation during the bonding process, the bonding process may be carried out in a reducing atmosphere such as a mixture of nitrogen and between about four percent (4%) and about ten percent (10%) hydrogen by volume.

In some embodiments, the TWIs 105 and the metallic structures 175 may comprise the same material (e.g., a metal or metal alloy, such as a copper-based alloy), and a metal-metal bond may be established between the TWIs 105 and the metallic structures 175. For example, a metal-metal non-thermo-compression bonding process may be used to form a bond between the TWIs 105 and the metallic structures 175. In such methods, external pressure is not applied between the semiconductor structure 140 and the processed semiconductor structure 170. In addition, the non-thermo-compression bonding may be carried out at room temperature and under atmospheric pressure.

Additionally, the semiconductor structure 140 may be permanently bonded to the processed semiconductor structure 170 by bonding dielectric material 178 to the substrate 106 of the semiconductor structure 100. The dielectric material 178 may comprise, for example, an oxide (e.g., silicon dioxide ($SiO_2$) or aluminum oxide ($Al_2O_3$)), a nitride (e.g., silicon nitride ($Si_3N_4$), boron nitride (BN) or aluminum nitride (AlN)), etc.

Figure 1E:
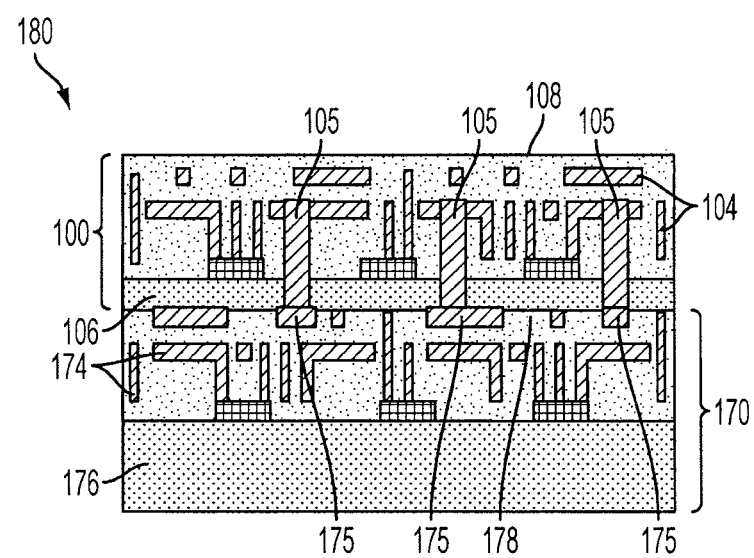

After permanently bonding the semiconductor structure 140 of FIG. 1C and the processed semiconductor structure 170, the semiconductor structure 122 that is temporarily bonded to the semiconductor structure 100 may be removed from the semiconductor structure 160 of FIG. 1D to form the semiconductor structure 180 shown in FIG. 1E. The semiconductor structure 122 may be removed from the semiconductor structure 160 by, for example, providing a mechanical force between the semiconductor structure 122 and the remaining portion of the semiconductor structure 160 (FIG. 1D).

For example, a rotational torque may be applied between the semiconductor structure 122 and the remaining portion of the semiconductor structure 160. To apply such a rotational torque between the semiconductor structure 122 and the remaining portion of the semiconductor structure 160, a first chuck device may be attached to the semiconductor structure 122 and a second chuck device may be attached to the remaining portion of the semiconductor structure 160, and a torque may be applied between the semiconductor structure 122 and the remaining portion of the semiconductor structure 160 by applying a rotational torque between the first chuck device and the second chuck device. Such chuck devices and equipment are known in the art.

As additional non-limiting embodiments, a blade may be inserted between the semiconductor structure 122 and the remaining portion of the semiconductor structure 160, a high-pressure fluid jet may be directed between the semiconductor structure 122 and the remaining portion of the semiconductor structure 160, or a bending force may be applied to the semiconductor structure 160 to separate the semiconductor structure 122 from the remaining portion of the semiconductor structure 160.

In the embodiments of the invention described above in relation to FIGS. 1A through 1E, TWIs 105 are present in the processed semiconductor structure 100 prior to bonding the processed semiconductor structure 100 to another processed semiconductor structure 170. In additional embodiments of the invention, TWIs may be formed through at least one processed semiconductor structure after bonding at least one processed semiconductor structure to at least one additional processed semiconductor structure. Examples of such methods are described below with reference to FIGS. 2A through 2E.

Figure 2A:
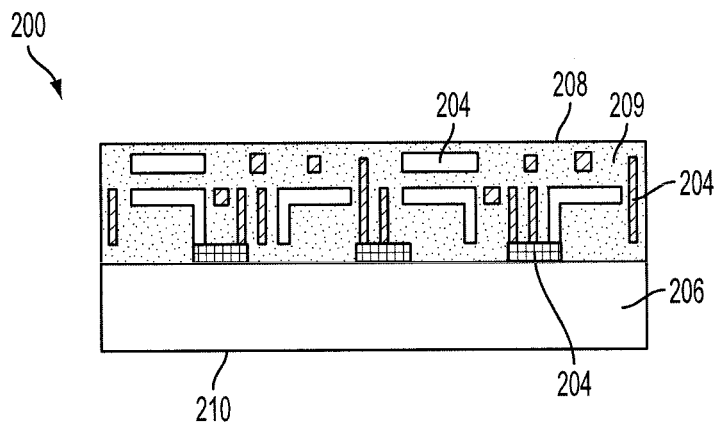
FIGS. 2A through 2E are simplified, schematic cross-sectional views of semiconductor structures and illustrate additional example embodiments of the invention for forming bonded semiconductor structures.

FIG. 2A illustrates a processed semiconductor structure 200 that includes a number of device structures 204. The device structures 204 are formed in and/or over a substrate 206. The substrate 206 may comprise, for example, one or more semiconductor materials, such as silicon (Si), germanium (Ge), a III-V semiconductor material, etc. Furthermore, the substrate 206 may comprise a single crystal of semiconductor material or an epitaxial layer of semiconductor material. In additional embodiments, the substrate 206 may comprise one or more dielectric materials, such as an oxide (e.g., silicon dioxide ($SiO_2$) or aluminum oxide ($Al_2O_3$)), a nitride (e.g., silicon nitride ($Si_3N_4$), boron nitride (BN) or aluminum nitride (AlN)), etc.

As shown in FIG. 2A, the device structures 204 do not include TWIs (such as the TWIs 105 of FIG. 1A) at this point in the fabrication process. The processed semiconductor structure 200 includes an active surface 208 and a back surface 210. The back surface 210 of the processed semiconductor structure 200 may comprise a generally flat, exposed major surface of the substrate 206. The active surface 208 of the processed semiconductor structure 200 may comprise one or more dielectric materials 209, such as an oxide (e.g., silicon dioxide ($SiO_2$) or aluminum oxide ($Al_2O_3$)), a nitride (e.g., silicon nitride ($Si_3N_4$), boron nitride (BN) or aluminum nitride (AlN)), etc.

Figure 2B:
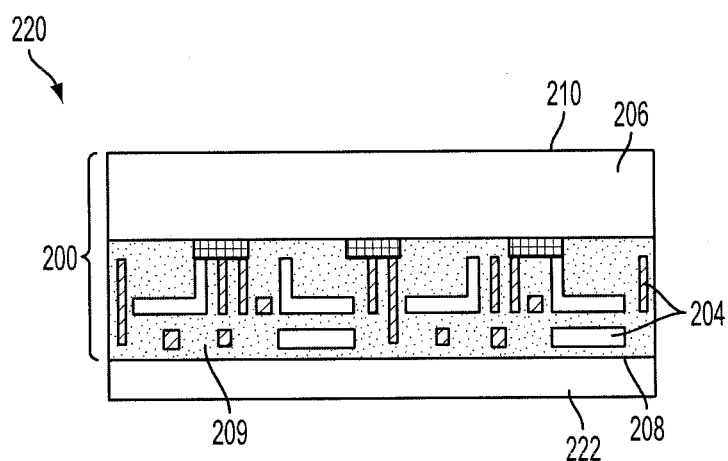

FIG. 2B illustrates a bonded semiconductor structure 220 that may be formed by temporarily bonding the processed semiconductor structure 200 of FIG. 2A to another semiconductor structure 222. The semiconductor structure 222 may comprise, for example, a carrier substrate. For example, the semiconductor structure 222 may comprise a semiconductor material, such as silicon (Si), germanium (Ge), a semiconductor material, etc. The semiconductor structure 222 optionally may comprise a single crystal of semiconductor material or an epitaxial layer of semiconductor material. In additional embodiments, the semiconductor structure 222 may comprise one or more dielectric materials, such as an oxide (e.g., silicon dioxide ($SiO_2$) or aluminum oxide ($Al_2O_3$)), a nitride (e.g., silicon nitride ($Si_3N_4$), boron nitride (BN) or aluminum nitride (AlN)), etc. The semiconductor structure 222 may comprise a material selected to exhibit a coefficient of thermal expansion that is at least substantially equal to a coefficient of thermal expansion exhibited by the semiconductor structure 200 of FIG. 2A (e.g., within about twenty percent (20%) of the coefficient of thermal expansion exhibited by the semiconductor structure 100).

With continued reference to FIG. 2B, the processed semiconductor structure 200 may be temporarily, directly bonded to the semiconductor structure 222 using any of the methods previously described herein for temporarily, directly bonding the processed semiconductor structure 100 of FIG. 1A to the semiconductor structure 122 of FIG. 1B. For example, any of the methods described herein in relation to FIGS. 1B, and 3 through 7 may be used to bond the processed semiconductor structure 200 to the semiconductor structure 222.

In additional embodiments of the invention, that the annealing process may comprise heating the semiconductor structure 200 and the semiconductor structure 222 in a furnace at a temperature of between about one hundred degrees Celsius (100° C.) and about eight hundred degrees Celsius (800° C.), or between about one hundred degrees Celsius (100° C.) and about four hundred degrees Celsius (400° C.), for a time of between about two minutes (2 min) and about fifteen hours (15 hr).

Figure 2C:
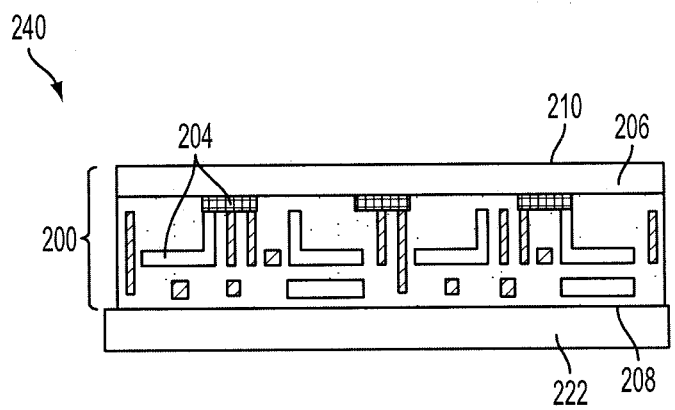

As shown in FIG. 2C, after temporarily bonding the semiconductor structure 222 to the processed semiconductor structure 200, the substrate 206 of the processed semiconductor structure 200 may be thinned to form another semiconductor structure 240. The substrate 206 may be thinned by, for example, removing material of the substrate 206 from the back surface 210 thereof. The material may be removed from the back surface 210 of the substrate 206 using at least one of a mechanical polishing process and a chemical etching process. For example, a chemical-mechanical polishing (CMP) process may be used to remove material of the substrate 206 from the back surface 210.

Figure 2D:
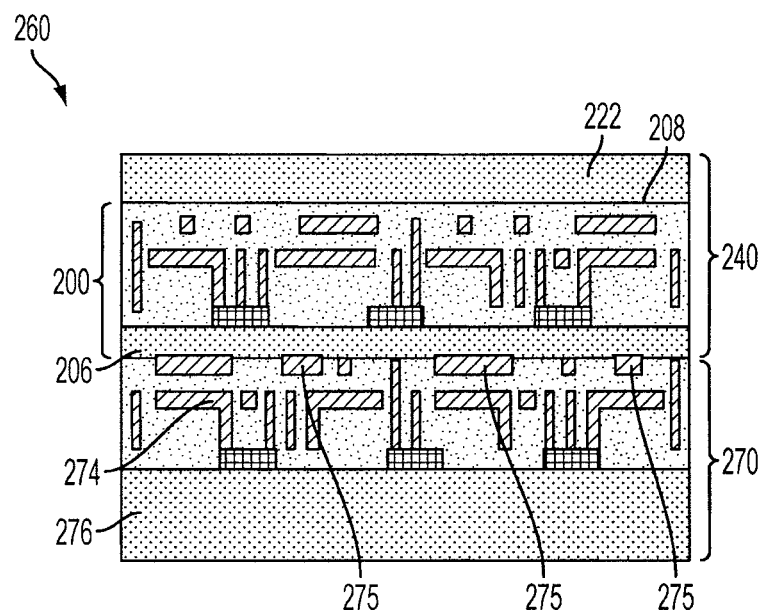

FIG. 2D illustrates another semiconductor structure 260 that may be formed by forming a permanent bond between the semiconductor structure 240 of FIG. 2C and another processed semiconductor structure 270. The permanent bond established between the semiconductor structure 240 and the semiconductor structure 270 along a bonding interface therebetween may result in a bonding energy between the semiconductor structure 240 and the semiconductor structure 270 that is at least about 1,200 mJ/m$^2$. More particularly, the permanent bond established between the semiconductor structure 240 and the semiconductor structure 270 may result in a bonding energy between the semiconductor structure 240 and the semiconductor structure 270 that is between about 1,600 mJ/m$^2$ and about 3,000 mJ/m$^2$.

The processed semiconductor structure 270 may be generally similar to the processed semiconductor structure 200 of FIG. 2A and may include a number of device structures 274 formed in and/or over a substrate 276. The substrate 276 may comprise a semiconductor material, such as any of those previously described in relation to the substrate 206 of FIG. 2A. The processed semiconductor structure 270 also may comprise metallic structures 275. The metallic structures 275 may comprise one or more of electrically conductive pads, traces, lines, etc. Furthermore, the metallic structures 275 may comprise a multi-layer or multi-region structure including, for example, transition regions, barrier regions, conductive regions, etc., each of which may comprise a different material.

The semiconductor structure 240 may be permanently bonded to the processed semiconductor structure 270 by bonding dielectric material 278 (FIG. 2E) to the substrate 206 of the semiconductor structure 200. The dielectric material 278 may comprise one or more of, for example, an oxide (e.g., silicon dioxide (SiO$_2$) or aluminum oxide (Al$_2$O$_3$)) or a nitride (e.g., silicon nitride (Si$_3$N$_4$), boron nitride (BN), aluminum nitride (AlN)), etc.

After permanently bonding the semiconductor structure 240 of FIG. 2C and the processed semiconductor structure 270, TWIs 205 may be formed through the semiconductor structure 200 and to the metallic structures 275. For example, vias may be formed by etching or laser-ablating through the semiconductor structure 200 to the metallic structures 275. One or more plating processes (e.g., an electroless plating process and/or an electrolytic plating process) then may be used to provide one or more conductive materials within the vias and on and over the metallic structures 275, thus forming the TWIs 205 to be structurally and electrically interconnected with the metallic structures 275.

Figure 2E:
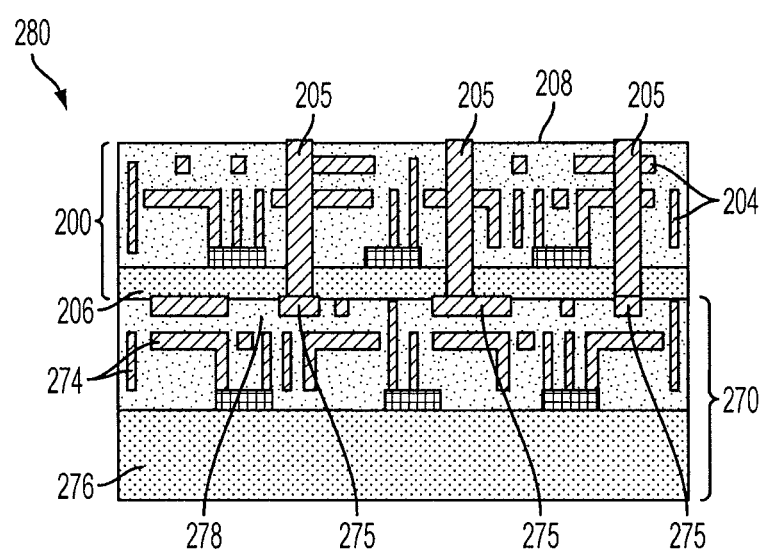

After permanently bonding the semiconductor structure 240 of FIG. 2C and the processed semiconductor structure 270, the semiconductor structure 222 that is temporarily bonded to the semiconductor structure 200 may be removed from the semiconductor structure 260 of FIG. 2D to form a semiconductor structure 280 shown in FIG. 2E. The semiconductor structure 222 may be removed from the semiconductor structure 260 using, for example, the methods previously discussed in relation to FIG. 1E.

Embodiments of the present invention may be used in the 3D integration of any type or types of semiconductor structures including die-to-die (D2D) integration, die-to-wafer (D2W), wafer-to-wafer (W2W) integration, or a combination of such integration processes.

For example, in a die-to-wafer (D2W) integration process, a processed semiconductor wafer may be temporarily, directly bonded to a carrier substrate wafer as previously described herein for subsequent handling and processing of the processed semiconductor wafer. The processed semiconductor wafer then may be separated from the carrier substrate wafer and mounted on tape. The processed semiconductor wafer then may be diced to form individual dies mounted on the tape, which can then be tested for proper operation. Known good dies (KGD) then may be picked and permanently bonded onto another processed semiconductor wafer using permanent bonding methods as previously described herein.

In another example of a die-to-wafer (D2W) integration process, known good dies (KGD) may be temporarily, directly bonded to a carrier substrate wafer as previously described herein for subsequent handling and processing (e.g., thinning and/or TWI formation) of the known good dies while mounted to the carrier substrate wafer. The processed known good dies then may be permanently bonded to another processed semiconductor wafer while the carrier substrate wafer remains bonded to the known good dies on opposite sides thereof from the another processed semiconductor wafer. The known good dies (and the another processed semiconductor wafer permanently bonded thereto) may be separated from the carrier substrate wafer.

Additional examples of non-limiting embodiments of the invention are described below.

Embodiment 1

A method of forming a bonded semiconductor structure, comprising: temporarily bonding a first semiconductor structure to a second semiconductor structure by providing direct atomic or molecular bonds between a bonding surface of the first semiconductor structure and a bonding surface of the second semiconductor structure; selecting the first semiconductor structure to have an active surface on a first side of the first semiconductor structure and a back surface on a second, opposite side of the first semiconductor structure and to comprise at least one device structure formed over a substrate; thinning the substrate of the first semiconductor structure by removing material of the substrate from the back surface of the first semiconductor structure; permanently bonding the back surface of the first semiconductor structure to a surface of a third semiconductor structure after thinning the substrate of the first semiconductor structure and while the first semiconductor structure remains temporarily bonded to the second semiconductor structure; and separating the second semiconductor structure from the first semiconductor structure.

Embodiment 2

The method of Embodiment 1, further comprising selecting the first semiconductor structure to include at least one through wafer interconnect, and wherein thinning the substrate of the first semiconductor structure comprises exposing at least a portion of the at least one through wafer interconnect through the back surface of the first semiconductor structure, and wherein permanently bonding the back surface of the first semiconductor structure to a surface of the third semiconductor structure comprises electrically interconnecting the at least one through wafer interconnect with at least one conductive structure of the third semiconductor structure.

Embodiment 3

The method of Embodiment 1, further comprising forming at least one through wafer interconnect through the first semiconductor structure and electrically interconnecting the at least one through wafer interconnect with at least one conductive structure of the third semiconductor structure after permanently bonding the back surface of the first semiconductor structure to the surface of the third semiconductor structure.

Embodiment 4

The method of any one of Embodiments 1 through 3, wherein temporarily bonding the first semiconductor structure to the second semiconductor structure comprises temporarily bonding the first semiconductor structure to the second semiconductor structure without using an adhesive between the first semiconductor structure and the second semiconductor structure.

Embodiment 5

The method of any one of Embodiments 1 through 4, wherein providing direct atomic or molecular bonds between the bonding surface of the first semiconductor structure and the bonding surface of the second semiconductor structure comprises providing direct atomic or molecular bonds between at least one of silicon oxide, silicon nitride and germanium oxide, and at least one of silicon, germanium, silicon oxide, silicon nitride and germanium oxide.

Embodiment 6

The method of any one of Embodiments 1 through 5, wherein temporarily bonding the first semiconductor structure to the second semiconductor structure comprises: forming each of the bonding surface of the first semiconductor structure and the bonding surface of the second semiconductor structure to have a surface roughness of about two nanometers (2 nm) or less; abutting the bonding surface of the first semiconductor structure against the bonding surface of the second semiconductor structure; and maintaining the bonding surface of the first semiconductor structure and the bonding surface of the second semiconductor structure at a temperature of between about two hundred degrees Celsius (200° C.) and about four hundred degrees Celsius (400° C.) for a time of between about two minutes (2 min) and about fifteen hours (15 hr).

Embodiment 7

The method of Embodiment 6, further comprising maintaining a pressure between the bonding surface of the first semiconductor structure and the bonding surface of the second semiconductor structure of between about 0.14 MPa and about 1.43 MPa while maintaining the bonding surface of the first semiconductor structure and the bonding surface of the second semiconductor structure at the temperature of between about two hundred degrees Celsius (200° C.) and about four hundred degrees Celsius (400° C.) for the time of between about two minutes (2 min) and about fifteen hours (15 hr).

Embodiment 8

The method of Embodiment 6 or Embodiment 7, further comprising activating at least one of the bonding surface of the first semiconductor structure and the bonding surface of the second semiconductor structure prior to abutting the bonding surface of the first semiconductor structure against the bonding surface of the second semiconductor structure.

Embodiment 9

The method of any one of Embodiments 1 through 5, wherein temporarily bonding the first semiconductor structure to the second semiconductor structure comprises forming a bonded interface area between the bonding surface of the first semiconductor structure and the bonding surface of the second semiconductor structure that is about eighty percent (80%) or less of the total area between the bonding surface of the first semiconductor structure and the bonding surface of the second semiconductor structure along a bonding interface therebetween.

Embodiment 10

The method of Embodiment 9, further comprising forming a plurality of recesses in at least one of the bonding surface of the first semiconductor structure and the bonding surface of the second semiconductor structure.

Embodiment 11

The method of Embodiment 10, wherein forming a plurality of recesses in at least one of the bonding surface of the first semiconductor structure and the bonding surface of the second semiconductor structure comprises: forming the plurality of recesses in a pattern on one of the bonding surface of the first semiconductor structure and the bonding surface of the second semiconductor structure; and selecting the pattern to comprise a mirror image of another pattern of metallic features on the other of the bonding surface of the first semiconductor structure and the bonding surface of the second semiconductor structure.

Embodiment 12

The method of Embodiment 10 or Embodiment 11, wherein forming a plurality of recesses in at least one of the bonding surface of the first semiconductor structure and the bonding surface of the second semiconductor structure comprises: depositing a first dielectric material over a second dielectric material on at least one of the bonding surface of the first semiconductor structure and the bonding surface of the second semiconductor structure; selecting the first dielectric material to comprise a low-temperature dielectric material that will undergo at least one of degradation, decomposition, and out-gassing upon heating the low-temperature dielectric material to a known temperature below about four hundred degrees Celsius (400° C.); and forming the plurality of recesses through at least a portion of the first dielectric material.

Embodiment 13

The method of Embodiment 12, further comprising heating the low-temperature dielectric material to a temperature above the known temperature to weaken a bond between the low-temperature dielectric material and another material.

Embodiment 14

The method of any one of Embodiments 1 through 5, wherein temporarily bonding the first semiconductor structure to the second semiconductor structure comprises forming at least one of the bonding surface of the first semiconductor structure and the bonding surface of the second semiconductor structure to have a surface roughness of between about one-quarter of a nanometer (0.25 nm) and about two nanometers (2.0 nm).

Embodiment 15

The method of Embodiment 14, wherein forming at least one of the bonding surface of the first semiconductor structure and the bonding surface of the second semiconductor structure to have a surface roughness of between about one-quarter of a nanometer (0.25 nm) and about two nanometers (2.0 nm) comprises forming each of the bonding surface of the first semiconductor structure and the bonding surface of the second semiconductor structure to have a surface roughness of between about one-half of a nanometer (0.5 nm) and about one nanometer (1.0 nm).

Embodiment 16

A method of forming a semiconductor structure, comprising: temporarily bonding a first semiconductor structure to a second semiconductor structure without using an adhesive between a bonding surface of the first semiconductor structure and a bonding surface of the second semiconductor structure; selecting the first semiconductor structure to have an active surface on a first side of the first semiconductor structure and a back surface on a second, opposite side of the first semiconductor structure and to comprise at least one device structure formed over a substrate; permanently bonding the back surface of the first semiconductor structure to a surface of a third semiconductor structure while the first semiconductor structure remains temporarily bonded to the second semiconductor structure; and separating the second semiconductor structure from the first semiconductor structure.

Embodiment 17

The method of Embodiment 16, wherein temporarily bonding the first semiconductor structure to the second semiconductor structure comprises: forming each of the bonding surface of the first semiconductor structure and the bonding surface of the second semiconductor structure to have a surface roughness of about two nanometers (2 nm) or less; abutting the bonding surface of the first semiconductor structure against the bonding surface of the second semiconductor structure; and maintaining the bonding surface of the first semiconductor structure and the bonding surface of the second semiconductor structure at a temperature of between about two hundred degrees Celsius (200° C.) and about four hundred degrees Celsius (400° C.) for a time of between about two minutes (2 min.) and about fifteen (15) hours.

Embodiment 18

The method of Embodiment 16 or Embodiment 17, further comprising activating at least one of the bonding surface of the first semiconductor structure and the bonding surface of the second semiconductor structure.

Embodiment 19

The method of any one of Embodiments 16 through 18, wherein temporarily bonding the first semiconductor structure to the second semiconductor structure comprises forming a bonding interface area between the bonding surface of the first semiconductor structure and the bonding surface of the second semiconductor structure that is about eighty percent (80%) or less of the total surface area of at least one of the bonding surface of the first semiconductor structure and the bonding surface of the second semiconductor structure.

Embodiment 20

The method of Embodiment 19, further comprising forming a plurality of recesses in at least one of the bonding surface of the first semiconductor structure and the bonding surface of the second semiconductor structure.

Embodiment 21

The method of Embodiment 20, wherein forming a plurality of recesses in at least one of the bonding surface of the first semiconductor structure and the bonding surface of the second semiconductor structure comprises: forming the plurality of recesses in a pattern on one of the bonding surface of the first semiconductor structure and the bonding surface of the second semiconductor structure; and selecting the pattern to comprise a mirror image of another pattern of metallic features on the other of the bonding surface of the first semiconductor structure and the bonding surface of the second semiconductor structure.

Embodiment 22

The method of Embodiment 20 or Embodiment 21, wherein forming a plurality of recesses in at least one of the bonding surface of the first semiconductor structure and the bonding surface of the second semiconductor structure comprises: depositing a first dielectric material over a second dielectric material on at least one of the bonding surface of the first semiconductor structure and the bonding surface of the second semiconductor structure; selecting the first dielectric material to comprise a low-temperature dielectric material that will undergo at least one of degradation, decomposition, and out-gassing upon heating the low-temperature dielectric material to a known temperature below about four hundred degrees Celsius (400° C.); and forming the plurality of recesses through at least a portion of the first dielectric material.

Embodiment 23

The method of Embodiment 22, further comprising heating the low-temperature dielectric material to a temperature above the known temperature to weaken a bond between the low-temperature dielectric material and another material.

Embodiment 24

The method of Embodiment 16, wherein temporarily bonding the first semiconductor structure to the second semiconductor structure comprises forming at least one of the bonding surface of the first semiconductor structure and the bonding surface of the second semiconductor structure to have a surface roughness of between about one-quarter of a nanometer (0.25 nm) and about two nanometers (2.0 nm).

Embodiment 25

A semiconductor structure, comprising: a first semiconductor structure having an active surface on a first side of the first semiconductor structure and a back surface on a second, opposite side of the first semiconductor structure, the first semiconductor structure comprising a substrate and at least one device structure formed over the substrate; a second semiconductor structure temporarily bonded to the first semiconductor structure without adhesive therebetween, a bonding energy between the first semiconductor structure and the second semiconductor structure being about 1,000 mJ/m² or less; a third semiconductor structure permanently bonded to the back surface of the first semiconductor structure, a bonding energy between the first semiconductor structure and the third semiconductor structure being at least about 1,200 mJ/m².

Embodiment 26

The semiconductor structure of Embodiment 25, further comprising direct atomic or molecular bonds between a bonding surface of the first semiconductor structure and a bonding surface of the second semiconductor structure.

Embodiment 27

The semiconductor structure of Embodiment 26, wherein the bonding surface of the first semiconductor structure comprises at least one of silicon oxide, silicon nitride and germanium oxide, and the bonding surface of the second semiconductor structure comprises at least one of silicon, germanium, silicon oxide, silicon nitride and germanium oxide.

Embodiment 28

The semiconductor structure of any one of Embodiments 25 through 27, further comprising at least one through wafer interconnect extending from the at least one device structure of the first semiconductor structure through the substrate of the first semiconductor structure to at least one conductive structure of the third semiconductor structure.

Embodiment 29

The semiconductor structure of Embodiment 25, wherein each of a bonding surface of the first semiconductor structure and a bonding surface of the second semiconductor structure have a surface roughness of about two nanometers (2 nm) or less.

Embodiment 30

The semiconductor structure of Embodiment 25, wherein at least one of a bonding surface of the first semiconductor structure and a bonding surface of the second semiconductor structure have a surface roughness of between about one-quarter of a nanometer (0.25 nm) and about two nanometers (2 nm).

Embodiment 31

The semiconductor structure of Embodiment 30, wherein each of the bonding surface of the first semiconductor structure and the bonding surface of the second semiconductor structure has a surface roughness of between about one-half of a nanometer (0.5 nm) and about one nanometer (1 nm).

Embodiment 32

The semiconductor structure of Embodiment 25, further comprising a plurality of recesses in at least one of a bonding surface of the first semiconductor structure and a bonding surface of the second semiconductor structure.

Embodiment 33

The semiconductor structure of Embodiment 32, wherein the recesses of the plurality of recesses are disposed in a pattern on one of the bonding surface of the first semiconductor structure and the bonding surface of the second semiconductor structure, and wherein the pattern comprises a mirror image of another pattern of metallic features on the other of the bonding surface of the first semiconductor structure and the bonding surface of the second semiconductor structure.

Embodiment 34

The semiconductor structure of Embodiment 32 or Embodiment 33, wherein the recesses of the plurality of recesses extend at least partially through a first dielectric material on at least one of the bonding surface of the first semiconductor structure and the bonding surface of the second semiconductor structure, the first dielectric material comprising a low-temperature dielectric material.

Embodiment 35

The semiconductor structure of Embodiment 34, further comprising a second dielectric material underlying the first dielectric material on the at least one of the bonding surface of the first semiconductor structure and the bonding surface of the second semiconductor structure, the second dielectric material comprising a high-temperature dielectric material.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims. Headings are used herein for clarity and convenience only and do not limit the scope of the claims below.

What is claimed is:

1. A method of forming a bonded semiconductor structure, comprising:
    temporarily bonding a first semiconductor structure to a second semiconductor structure by providing direct atomic or molecular bonds between a bonding surface of the first semiconductor structure and a bonding surface of the second semiconductor structure;
    selecting the first semiconductor structure to have an active surface on a first side of the first semiconductor structure and a back surface on a second, opposite side of the first semiconductor structure and to comprise at least one device structure formed over a substrate;
    thinning the substrate of the first semiconductor structure by removing material of the substrate from the back surface of the first semiconductor structure;
    permanently bonding the back surface of the first semiconductor structure to a surface of a third semiconductor structure after thinning the substrate of the first semiconductor structure and while the first semiconductor structure remains temporarily bonded to the second semiconductor structure; and
    separating the second semiconductor structure from the first semiconductor structure.

2. The method of claim 1, further comprising selecting the first semiconductor structure to include at least one through wafer interconnect, and wherein thinning the substrate of the first semiconductor structure comprises exposing at least a portion of the at least one through wafer interconnect through the back surface of the first semiconductor structure, and wherein permanently bonding the back surface of the first semiconductor structure to a surface of the third semiconductor structure comprises electrically interconnecting the at least one through wafer interconnect with at least one conductive structure of the third semiconductor structure.

3. The method of claim 1, further comprising forming at least one through wafer interconnect through the first semiconductor structure and electrically interconnecting the at least one through wafer interconnect with at least one conductive structure of the third semiconductor structure after permanently bonding the back surface of the first semiconductor structure to the surface of the third semiconductor structure.

4. The method of claim 1, wherein temporarily bonding the first semiconductor structure to the second semiconductor structure comprises temporarily bonding the first semiconductor structure to the second semiconductor structure without using an adhesive between the first semiconductor structure and the second semiconductor structure.

5. The method of claim 4, wherein providing direct atomic or molecular bonds between the bonding surface of the first semiconductor structure and the bonding surface of the second semiconductor structure comprises providing direct atomic or molecular bonds between at least one of silicon oxide, silicon nitride and germanium oxide, and at least one of silicon, germanium, silicon oxide, silicon nitride and germanium oxide.

6. The method of claim 1, wherein temporarily bonding the first semiconductor structure to the second semiconductor structure comprises:
    forming each of the bonding surface of the first semiconductor structure and the bonding surface of the second semiconductor structure to have a surface roughness of about two nanometers (2 nm) or less;
    abutting the bonding surface of the first semiconductor structure against the bonding surface of the second semiconductor structure; and
    maintaining the bonding surface of the first semiconductor structure and the bonding surface of the second semiconductor structure at a temperature of between about two hundred degrees Celsius (200° C.) and about four hundred degrees Celsius (400° C.) for a time of between about two minutes (2 min) and about fifteen hours (15 hr).

7. The method of claim 6, further comprising maintaining a pressure between the bonding surface of the first semiconductor structure and the bonding surface of the second semiconductor structure of between about 0.14 MPa and about 1.43 MPa while maintaining the bonding surface of the first semiconductor structure and the bonding surface of the second semiconductor structure at the temperature of between about two hundred degrees Celsius (200° C.) and about four hundred degrees Celsius (400° C.) for the time of between about two minutes (2 min) and about fifteen hours (15 hr).

8. The method of claim 6, further comprising activating at least one of the bonding surface of the first semiconductor structure and the bonding surface of the second semiconductor structure prior to abutting the bonding surface of the first semiconductor structure against the bonding surface of the second semiconductor structure.

9. The method of claim 1, wherein temporarily bonding the first semiconductor structure to the second semiconductor structure comprises forming a bonded interface area between the bonding surface of the first semiconductor structure and the bonding surface of the second semiconductor structure that is about eighty percent (80%) or less of the total area between the bonding surface of the first semiconductor structure and the bonding surface of the second semiconductor structure along a bonding interface therebetween.

10. The method of claim 9, further comprising forming a plurality of recesses in at least one of the bonding surface of the first semiconductor structure and the bonding surface of the second semiconductor structure.

11. The method of claim 10, wherein forming a plurality of recesses in at least one of the bonding surface of the first semiconductor structure and the bonding surface of the second semiconductor structure comprises:
    forming the plurality of recesses in a pattern on one of the bonding surface of the first semiconductor structure and the bonding surface of the second semiconductor structure; and
    selecting the pattern to comprise a mirror image of another pattern of metallic features on the other of the bonding surface of the first semiconductor structure and the bonding surface of the second semiconductor structure.

12. The method of claim 10, wherein forming a plurality of recesses in at least one of the bonding surface of the first semiconductor structure and the bonding surface of the second semiconductor structure comprises:
    depositing a first dielectric material over a second dielectric material on at least one of the bonding surface of the first semiconductor structure and the bonding surface of the second semiconductor structure;
    selecting the first dielectric material to comprise a low-temperature dielectric material that will undergo at least one of degradation, decomposition, and out-gassing upon heating the low-temperature dielectric material to a known temperature below about four hundred degrees Celsius (400° C.); and
    forming the plurality of recesses through at least a portion of the first dielectric material.

13. The method of claim 12, further comprising heating the low-temperature dielectric material to a temperature above the known temperature to weaken a bond between the low-temperature dielectric material and another material.

14. The method of claim 1, wherein temporarily bonding the first semiconductor structure to the second semiconductor structure comprises forming at least one of the bonding surface of the first semiconductor structure and the bonding surface of the second semiconductor structure to have a surface roughness of between about one-quarter of a nanometer (0.25 nm) and about two nanometers (2.0 nm).

15. The method of claim 14, wherein forming at least one of the bonding surface of the first semiconductor structure and the bonding surface of the second semiconductor structure to have a surface roughness of between about one-quarter of a nanometer (0.25 nm) and about two nanometers (2.0 nm) comprises forming each of the bonding surface of the first semiconductor structure and the bonding surface of the second semiconductor structure to have a surface roughness of between about one-half of a nanometer (0.5 nm) and about one nanometer (1.0 nm).

16. A method of forming a semiconductor structure, comprising:
    temporarily bonding a first semiconductor structure to a second semiconductor structure without using an adhesive between a bonding surface of the first semiconductor structure and a bonding surface of the second semiconductor structure;
    selecting the first semiconductor structure to have an active surface on a first side of the first semiconductor structure and a back surface on a second, opposite side of the first semiconductor structure and to comprise at least one device structure formed over a substrate;

permanently bonding the back surface of the first semiconductor structure to a surface of a third semiconductor structure while the first semiconductor structure remains temporarily bonded to the second semiconductor structure; and separating the second semiconductor structure from the first semiconductor structure.

17. The method of claim 16, wherein temporarily bonding the first semiconductor structure to the second semiconductor structure comprises:

forming each of the bonding surface of the first semiconductor structure and the bonding surface of the second semiconductor structure to have a surface roughness of about two nanometers (2 nm) or less;

abutting the bonding surface of the first semiconductor structure against the bonding surface of the second semiconductor structure; and maintaining the bonding surface of the first semiconductor structure and the bonding surface of the second semiconductor structure at a temperature of between about two hundred degrees Celsius (200° C.) and about four hundred degrees Celsius (400° C.) for a time of between about two minutes (2 min) and about fifteen hours (15 hr).

18. The method of claim 16, further comprising activating at least one of the bonding surface of the first semiconductor structure and the bonding surface of the second semiconductor structure.

19. The method of claim 16, wherein temporarily bonding the first semiconductor structure to the second semiconductor structure comprises forming a bonding interface area between the bonding surface of the first semiconductor structure and the bonding surface of the second semiconductor structure that is about eighty percent (80%) or less of the total surface area of at least one of the bonding surface of the first semiconductor structure and the bonding surface of the second semiconductor structure.

20. The method of claim 19, further comprising forming a plurality of recesses in at least one of the bonding surface of the first semiconductor structure and the bonding surface of the second semiconductor structure.

21. The method of claim 20, wherein forming a plurality of recesses in at least one of the bonding surface of the first semiconductor structure and the bonding surface of the second semiconductor structure comprises:

forming the plurality of recesses in a pattern on one of the bonding surface of the first semiconductor structure and the bonding surface of the second semiconductor structure; and selecting the pattern to comprise a mirror image of another pattern of metallic features on the other of the bonding surface of the first semiconductor structure and the bonding surface of the second semiconductor structure.

22. The method of claim 20, wherein forming a plurality of recesses in at least one of the bonding surface of the first semiconductor structure and the bonding surface of the second semiconductor structure comprises:

depositing a first dielectric material over a second dielectric material on at least one of the bonding surface of the first semiconductor structure and the bonding surface of the second semiconductor structure;

selecting the first dielectric material to comprise a low-temperature dielectric material that will undergo at least one of degradation, decomposition, and out-gassing upon heating the low-temperature dielectric material to a known temperature below about four hundred degrees Celsius (400° C.); and forming the plurality of recesses through at least a portion of the first dielectric material.

23. The method of claim 22, further comprising heating the low-temperature dielectric material to a temperature above the known temperature to weaken a bond between the low-temperature dielectric material and another material.

24. The method of claim 16, wherein temporarily bonding the first semiconductor structure to the second semiconductor structure comprises forming at least one of the bonding surface of the first semiconductor structure and the bonding surface of the second semiconductor structure to have a surface roughness of between about one-quarter of a nanometer (0.25 nm) and about two nanometers (2.0 nm).

* * * * *